(12) United States Patent
Gächter

(10) Patent No.: US 8,395,130 B2
(45) Date of Patent: Mar. 12, 2013

(54) HOLDER FOR AN ELECTRON MICROSCOPY SAMPLE CARRIER

(75) Inventor: Leander Gächter, Oberriet (CH)

(73) Assignee: Leica Microsystems (Schweiz) AG, Heerbrugg (CH)

( * ) Notice: Subject to any disclaimer, the term of this patent is extended or adjusted under 35 U.S.C. 154(b) by 0 days.

(21) Appl. No.: 13/304,711

(22) Filed: Nov. 28, 2011

(65) Prior Publication Data

US 2012/0132828 A1    May 31, 2012

(30) Foreign Application Priority Data

Nov. 29, 2010  (AT) ......................................  1986/10

(51) Int. Cl.
*H01J 37/20*  (2006.01)
*H01J 37/26*  (2006.01)
*G01N 23/225*  (2006.01)

(52) U.S. Cl. .............. 250/440.11; 250/442.11; 250/306; 250/310; 250/311

(58) Field of Classification Search ............. 250/440.11, 250/442.11, 306, 310, 311
See application file for complete search history.

(56) References Cited

U.S. PATENT DOCUMENTS 6,002,136 A  * 12/1999  Naeem ...................... 250/442.11
7,906,762 B2 *  3/2011  Bierhoff et al. ............... 250/310
8,309,921 B2 * 11/2012  Bierhoff et al. ............... 250/310

FOREIGN PATENT DOCUMENTS

| EP | 1868225 | 12/2007 |
| EP | 1947675 | 7/2008 |
| WO | 0010191 | 2/2000 |

* cited by examiner

*Primary Examiner* — Nikita Wells
(74) *Attorney, Agent, or Firm* — Hodgson Russ LLP

(57) ABSTRACT

A mount (100, 200) for holding an electron microscopy sample carrier (310) comprises a base plate (101) having an opening (103) through a middle region thereof and a support surface (107) for the sample carrier (310) extending at least partly around the opening (103), a holding apparatus (104a, 104b) for frictionally engaged holding of the sample carrier (310) on the support surface (107) being provided on the base plate (101), the holding apparatus (104a, 104b) comprising at least two mutually independent clip elements (104a, 104b) that extend from the base plate (101) toward the opening (103) and by means of which edge regions (313a, 313b), spaced apart from one another, of the electron microscopy sample carrier (310) are holdable on the support surface (107). The invention further encompasses a loading apparatus for loading a mount with an electron microscopy sample carrier, and a method for using the loading apparatus.

22 Claims, 4 Drawing Sheets

HOLDER FOR AN ELECTRON MICROSCOPY SAMPLE CARRIER

CROSS REFERENCE TO RELATED APPLICATIONS

Figure 1:
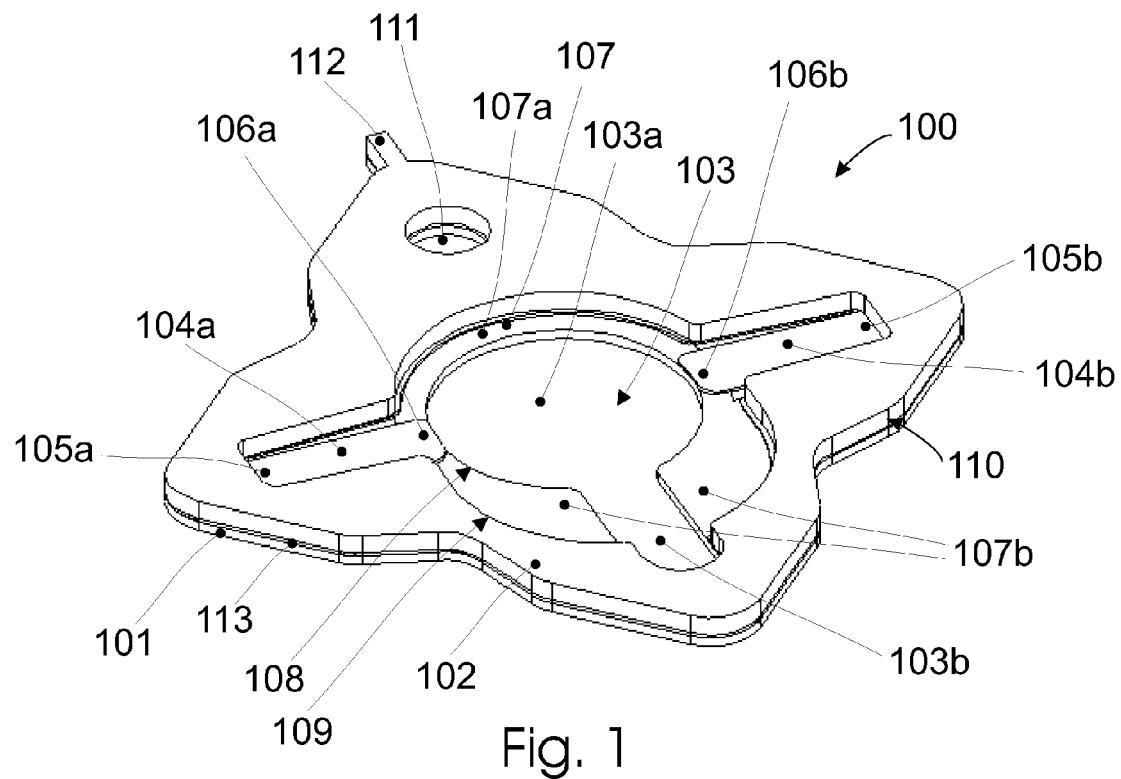

This application claims priority of Austrian patent application number A 1986/2010 filed Nov. 29, 2010, the entire disclosure of which is incorporated by reference herein.

FIELD OF THE INVENTION

The present invention relates to a mount for holding an electron microscopy sample carrier, which mount comprises a base plate having an opening in a middle region of the base plate passing through the latter, and a support surface, extending at least partly around the opening, for the sample carrier, a holding apparatus for frictionally engaged holding of the sample carrier on the support surface being provided on the base plate.

The invention further relates to a loading apparatus and to a method for loading a mount in accordance with the invention with an electron microscopy sample carrier.

The invention further relates to a specimen holder apparatus for an electron microscope, encompassing a mount in accordance with the invention.

BACKGROUND OF THE INVENTION

The capabilities of electron microscopy, principally of high-resolution transmission electron microscope, are considerable. Thanks to this technology, it has been possible to make great strides in research and information recovery in the context of examination of, for example, biological ultrastructures or semiconductor structures.

Because of the high vacuum that exists in the transmission electron microscope (TEM) and the high-energy electron beam, a sample preparation process that retains the structure is usually necessary. This is especially the case with biological samples. For high-resolution transmission electron microscope imaging, it is furthermore absolutely necessary that the sample be sufficiently thin. TEM samples are applied onto suitable sample carriers for examination. These are typically very small, round, delicate grids with a diameter from 2 to 3 mm. The grids have variously shaped holes (honeycomb, slits, etc.) or a lattice of a defined mesh count. The grids are usually coated with a thin film and can moreover also comprise further coatings.

For examination under the electron microscope, the sample carrier with the sample located on it must be retained in a suitable specimen holder apparatus. For most applications, the specimen holder apparatus is implemented as a goniometer, side-entry goniometers being predominantly used. With one-piece specimen holder apparatuses, the sample carrier is placed in an aperture of the sample holder apparatus and retained there. Alternatively, multi-part specimen holder apparatuses such as those described in EP 1 868 225 A1 and EP 1 947 675 A1 are increasingly be used. With these multi-part apparatuses, the sample carrier is first retained in a frame-like mount (also referred to as a "cartridge"), and the mount is then reversibly fastened in a corresponding holder of the specimen holder apparatus.

Electron microscope specimen holder apparatuses and mount apparatuses must meet specific requirements.

In addition to very high mechanical stability and high-vacuum compatibility, the retention and mounting of a sample carrier in the specimen holder apparatus is highly relevant because of the delicate nature of the sample carriers that are used. For proper examination and in order to prevent loss of the sample carrier, the sample carrier must be retained in a stable and vibration-free manner. In addition, distortions of the delicate sample carrier must be avoided, since otherwise it is easily damaged. In known specimen holder apparatuses such as those that have been disclosed, for example, by EP 1 947 675 A1 and U.S. Pat. No. 6,002,136, the grid is held in the aperture of the specimen holder apparatus with the aid of a securing ring. This securing ring is usually press-fitted using a tool, which has a disadvantageous effect on the coating of the sample carrier. These coatings are typically very brittle and can easily be destroyed by distortion upon installation of the sample carrier and the securing ring. Furthermore, the securing rings are small elements that are cumbersome to handle and can easily become lost, especially when they need to be loaded into the installation tool.

For many applications, provision is made for highly precise and stable tilting of the specimen around one or more axes lying in the specimen plane. WO 00/10191, for example, describes a side-entry specimen holder apparatus with double tilting. With the construction described above using a securing ring, the potential of such applications can, disadvantageously, not be entirely exploited. Securing rings require a groove in order to press the sample carrier onto the annular support in the aperture. The securing ring and the groove necessitate an annular configuration that is slightly smaller than the grid diameter. This results in a limitation of the tilt angle, and consequently in reduced recovery of information from electron microscopy observation.

For certain electron microscope applications it is furthermore necessary for the sample to be transferable from the sample preparation apparatus into the TEM, and for good thermal contact to exist between the EM specimen holder apparatuses and the sample. This is essential especially in the case of cryo-electron microscopic applications in structural biology. With this technology, an aqueous sample is cryo-fixed, i.e. it is cooled very rapidly, avoiding the formation of ice crystals. The objects to be examined, for example cells, enzymes, viruses, or lipid layers, are thereby embedded in a thin, vitrified ice layer. Transfer of the cryofixed sample involves critical handling and possibilities for contamination. Specially cooled EM specimen holder apparatuses and mounts, which enable the transfer of a cryofixed sample, are used for this.

SUMMARY OF THE INVENTION

It is therefore an object of the invention to eliminate the disadvantages of the existing art as discussed above and moreover to make available a mount that corresponds to the stringent requirements described above. What is consequently to be made available is a mount for an electron microscopy sample carrier with which stable, stress-free retention of the sample carrier is possible, so that the sample carrier having the sample is not negatively affected. A further intention is to ensure good thermal contact between the mount and the sample carrier. The mount is moreover intended to enable the largest possible tilt angle.

This object is achieved with a mount of the kind cited initially in which, according to the present invention, the holding apparatus encompasses, for frictionally engaged holding of the sample carrier, at least two mutually independent clip elements that extend from the base plate toward the opening and by means of which edge regions, spaced apart from one another, of the electron microscopy sample carrier are holdable on the support surface.

The invention makes possible stable and stress-free retention of the sample carrier. As compared with the securing ring known from the existing art, the sample carrier is held in stress-free fashion. Installation is also substantially simpler, and distortion of the sample carrier during installation is avoided. The risk of destroying the sample carrier and the samples present on it, is thereby kept very low.

Despite the stress-free retention of the sample carrier in the mount, good thermal contact exists between the mount and the sample carrier. This is particularly important for specimens for which a specific temperature level must be maintained during examination.

The mount according to the present invention makes possible a larger tilt angle as compared with the configuration using a securing ring, since an annular groove and an annular fastening element are not provided.

A further advantage is the simple configuration and simple, practical handling of the mount, since small, easily lost, and difficult-to-handle parts can be dispensed with. Thanks to the invention, sample carriers can be not only easily placed in, but also just as easily removed from the mount without damaging them.

It has further been found that the mount according to the present invention can be manufactured in cost-saving fashion. For example, it can also be manufactured as a product for one-time use.

The mount according to the present invention is usefully manufactured from high-vacuum-compatible materials. High-vacuum-compatible materials must not contain water molecules or lead. In addition, they should not have any porous surfaces. Preferred materials are copper and beryllium-copper.

The mount according to the present invention is provided chiefly for the purpose of being received by an electron microscope specimen holder apparatus. The specimen holder apparatus is preferably implemented as a goniometer, an implementation in the form of a side-entry goniometer being particularly preferred. The manner of operation and basic construction of a goniometer and a side-entry goniometer are well known to one skilled in the relevant art. The mount according to the present invention is, in this context, receivable and releasably fastenable in a corresponding holder of the specimen holder apparatus or the goniometer. EP 1 947 675 A1, for example, describes a specimen holder apparatus that comprises two parallel holding bars; the bars engage into a groove extending around the outer edge of the mount. In EP 1 868 225 A1, the mount is fastened in the specimen holder apparatus by means of a snap mechanism.

The invention consequently also refers to a specimen holder apparatus for an electron microscope that encompasses a releasably receivable mount according to the present invention.

For many applications, highly precise and stable tilting of the specimen around one or more axes lying in the specimen plane is necessary. It is consequently advantageous if the mount according to the present invention is mounted in the specimen holder apparatus tiltably around at least one axis lying in the sample-carrier plane, preferably around two axes lying in the sample-carrier plane. Such tilting mechanisms are known from the existing art and are described, for example, in WO 00/10191.

A further advantage of the mount to be mentioned at this juncture is the transferability of the mount, in particular transferability from the sample preparation apparatus, such as e.g. a cryogenic chamber for preparing sample for cryo-electron microscopy, into an electron microscope. The mount according to the present invention is suitable in particular for use in transmission electron microscopy, in particular in transmission cryo-electron microscopy.

The mount is designed so that it suitable for holding standard electron microscopy sample carriers. For this, the dimensions of the opening in the base plate, of the support surface for the sample carrier, and of the clip elements are adapted to the respective sample carrier in the context of manufacture. Such sample carriers typically have a standard size. The term "sample carrier" used herein refers to all carriers known to one skilled in the relevant art and suitable for electron microscopy and for electron microscopy sample preparation. The term "sample carrier" refers in particular to the grids ("grid carrier," "microgrid," "grid") already mentioned above, in which context the grids can comprise variously shaped holes (honeycomb, slits, etc.) or a lattice having a defined mesh count, and/or can be coated with a film (e.g. coated grids of the Quantifoil company) and/or carbon vapor coated. The diameter of standard grids is typically 2 to 3 mm.

Instead of the term "mount," the term "cartridge" is also used hereinafter with the same meaning.

According to the present invention, the mount can encompass two or more clip elements. The mount preferably encompasses two to three clip elements. In a particularly preferred embodiment, the holding apparatus encompasses exactly two clip elements. This on the one hand represents the simplest design, and on the other hand makes possible stable and stress-free installation and mounting of the sample carrier for undisturbed electron microscopy observation. In addition, very good thermal contact is ensured. Because the sample carrier is held in the mount only at two edge regions, a large tilt angle is possible. For example, a sample surface having a diameter of 2 mm can be observed at an angle of 70° under the electron microscope ("0°" meaning perpendicular to the sample).

For stable holding of the sample carrier in the mount, in this embodiment the clip elements are preferably arranged opposite one another.

Particularly gentle and stress-free holding of the sample carrier in the mount results when the clip elements are embodied in strip-shaped (tongue-shaped) fashion and are arranged substantially parallel to the base plate. It is of course also possible for the clip elements to be configured in wire-shaped fashion with a round cross section, although the strip-shaped configuration is preferred for the reasons recited above.

In a particularly preferred and easily implemented embodiment, the clip elements are embodied as spring elements. The sample carrier is, in this context, held by spring force with a preload in the direction of the base surface or support surface. The spring element is preferably embodied in strip-shaped (tongue-shaped) fashion as described above.

Usefully, each clip element comprises a first end retained on the base plate and a second end, oriented toward the opening, for frictionally engaged holding of the sample carrier on the support surface. The first end of the clip element is preferably secured on the base plate by a spot weld.

The second end of the clip element is preferably even with the edge of the support surface at the opening. The sample carrier is held particularly securely in the mount because the entire width of the support surface is utilized, and on the other hand the second end of the clip element does not extend into the opening in the base surface, thereby allowing the electron beam to pass through without impediment.

It is particularly advantageous if the mount comprises a cover plate arranged on the base plate, the cover plate comprising in a middle region an open region enabling access to the sample carrier and to the clip elements. The open region in the access to the sample carrier is preferably configured so that the sample carrier can be fitted into this region. This facilitates orientation of the sample carrier in the mount. With reference to access to the clip elements, the open region in the cover plate is configured so that the clip elements can be manipulated for placement of the sample carrier.

In an advantageous embodiment, the first end of each clip element is retained between the base plate and the cover plate. The second end of each clip element is arranged in the open region of the cover plate, and is therefore accessible. A very compact and easily manipulated mount is thereby obtained. The base plate, clip elements, and cover plate are preferably connected to one another by spot welding. The middle region of the cover plate corresponds substantially to the middle region of the base plate. With this mount assembled from two plates, the upper cover plate is embodied in correspondingly elastic fashion in order to enable welding to the base plate.

In a further advantageous embodiment, the mount comprises an intermediate plate arranged between the base plate and the cover plate, the clip elements being components of the intermediate plate. The intermediate plate comprises, in a middle region, an open region that preferably corresponds substantially to the open region of the cover plate, the clip elements extending into the open region. With this mount assembled from three plates, the intermediate plate is preferably embodied integrally with the clip elements, the thickness of the intermediate plate preferably corresponding to the thickness of the clip elements.

For low-stress and manageable installation of the sample carrier in the mount, it is advantageous for practical reasons if the open region in the cover plate has a size that permits the sample carrier to be put in place eccentrically, such that the sample carrier can be placed into the mount alongside that position in which the sample carrier can be held in the mount, and then laterally displaced into the position in which the sample carrier can be held in the mount. In embodiments in which an intermediate plate is used, the open region of the intermediate plate once again, as mentioned above, corresponds substantially to the open region of the cover plate, thus ensuring access to the support surface and the sample carrier. The clip elements extend into the open region.

For specific electron microscopy applications, the mount comprises an outer edge having a rotationally symmetrical conformation, in particular corresponding to a four-fold rotational symmetry. The mount is preferably embodied in substantially polygonal, in particular rectangular fashion.

In a further embodiment, the mount comprises a substantially round outer edge. For many applications, highly precise and stable tilting of the specimen around one or more axes lying in the specimen plane is necessary. "Substantially round" is to be understood as an outer edge that is preferably circular. The outer edge can also, however, be of oval configuration. A round outer edge is particularly advantageous when the mount is utilized in a so-called "double-tilt" goniometer. One skilled in the relevant art is very familiar with double-tilt goniometers. WO 00/10191, for example describes a side-entry specimen holder apparatus of this kind with double tilting. The invention consequently also refers to double-tilt goniometers that comprise a mount according to the present invention.

In a preferred embodiment, for installation of the sample carrier in the mount, provision is made that an opening extending through the base plate is arranged beneath each clip element. The clip elements can be raised with the aid of engagement elements that are introduced from below through the opening. Once the sample carrier has been put in place, it is held in the mount by removing the tool and lowering the clip elements in their original position. A loading apparatus for installing the sample carrier in the mount, and the installation method, are described in detail below and later on in FIGS. 4 to 7.

The invention further relates to a loading apparatus for loading a mount with an electron microscopy sample carrier, encompassing:
    a mount according to the present invention in which an opening extending through the base plate is arranged beneath each clip element, and
    a loading assistance element into which the mount is placeable, the loading assistance element comprising engagement elements that extend through the openings arranged beneath each clip element in the base plate of the mount, and that move the clip elements of the mount, against their holding force, in a direction away from the base plate.

The engagement elements arranged on the loading assistance elements are preferably peg-shaped. The loading assistance element is preferably embodied in block-shaped fashion and comprises, for easier orientation of the mount when being put in place, a recess that corresponds to the external shape of the mount. It is thereby possible to correctly orient the openings arranged in the base plate of the mount with respect to the engagement elements arranged on the loading assistance element.

The invention further relates to a method for loading a mount with an electron microscopy sample carrier by means of a loading apparatus as described above, having the steps of:
    a) placing the mount into the loading assistance element,
    b) moving the clip elements, by means of the engagement elements of the loading assistance element, in a direction away from the base plate into a raised position,
    c) placing the sample carrier onto the support surface of the mount, and
    d) removing the mount from the loading assistance element and holding the sample carrier in frictionally engaged fashion on the support surface by moving the clip elements back into their original position.

In order to carry out the method, the clip elements are particularly preferably embodied as spring elements.

BRIEF DESCRIPTION OF THE DRAWING VIEWS

Figure 2:
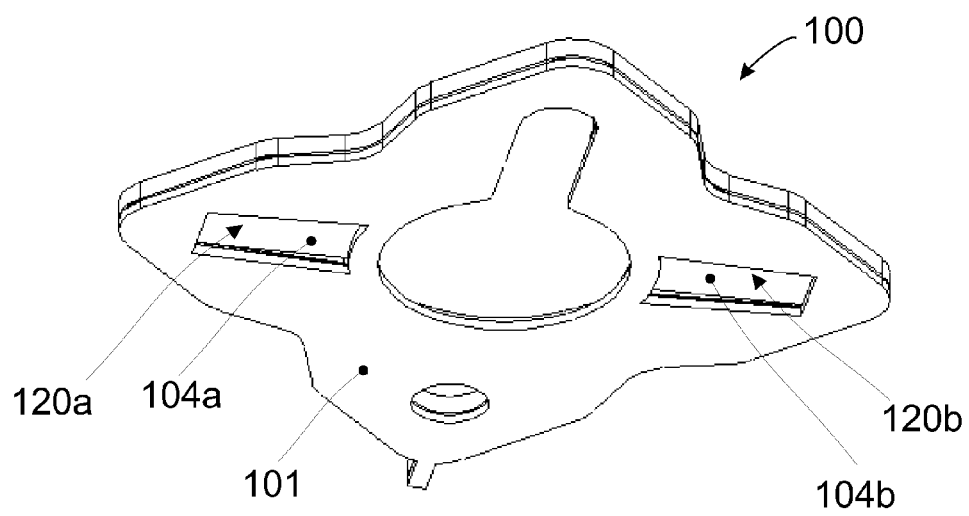
Figure 3:
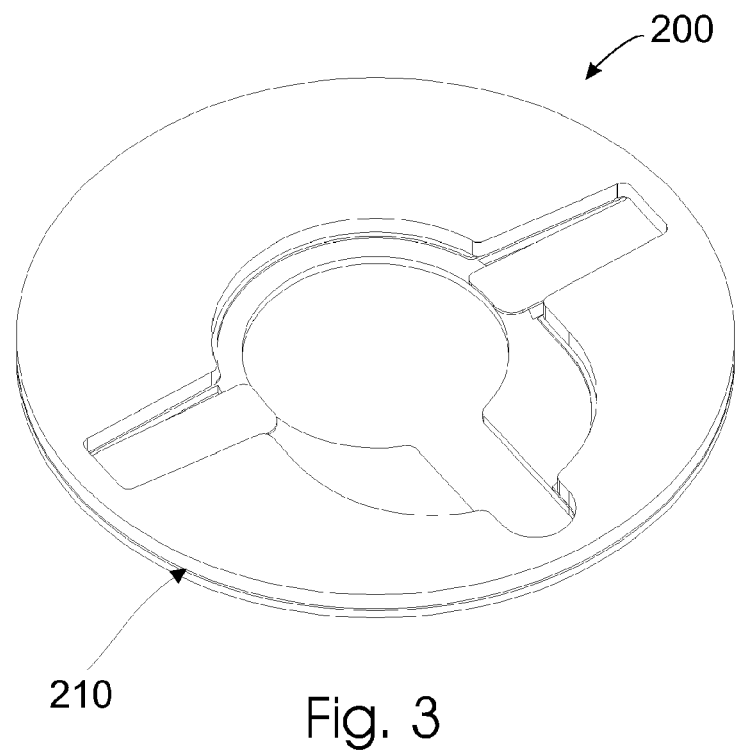
Figure 4:
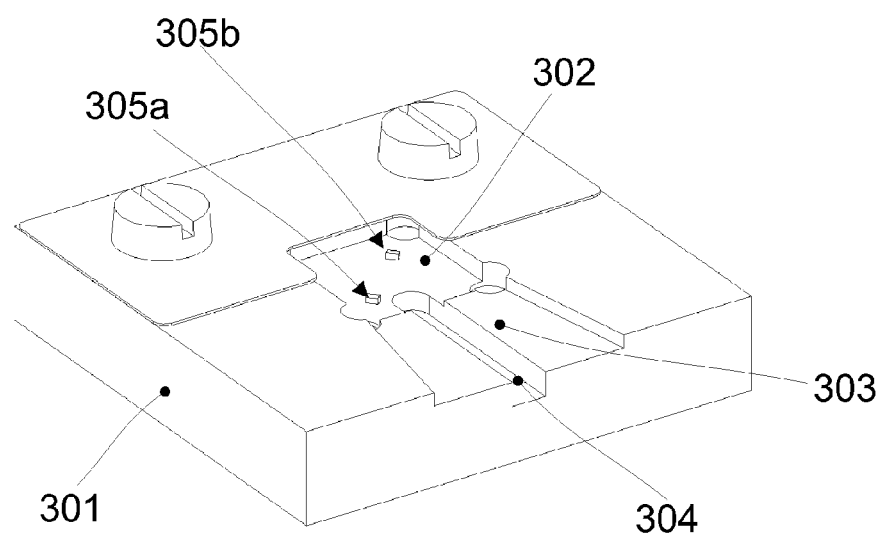
Figure 5:
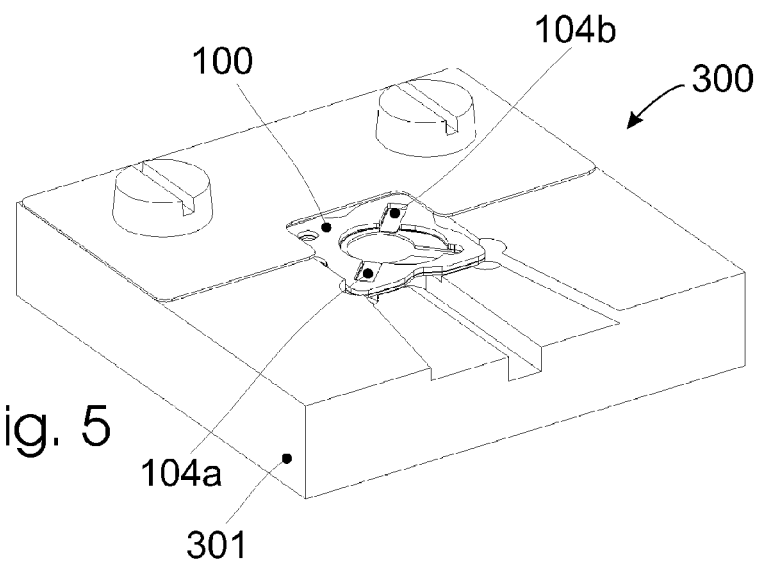
Figure 6:
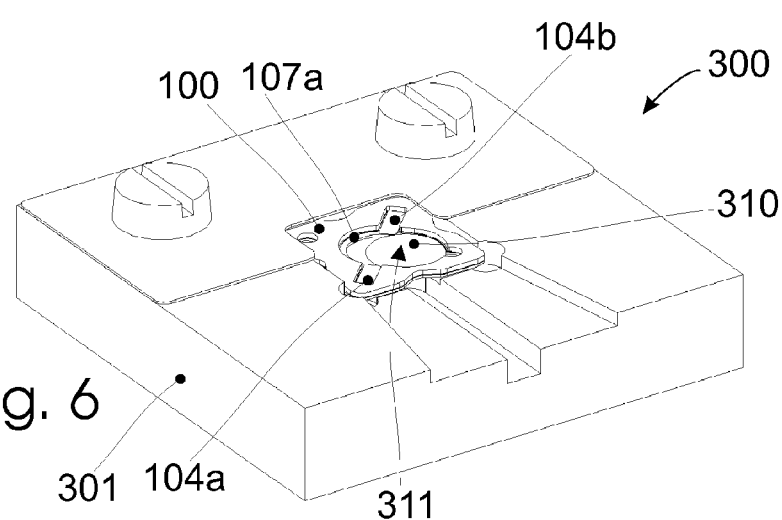
Figure 7:
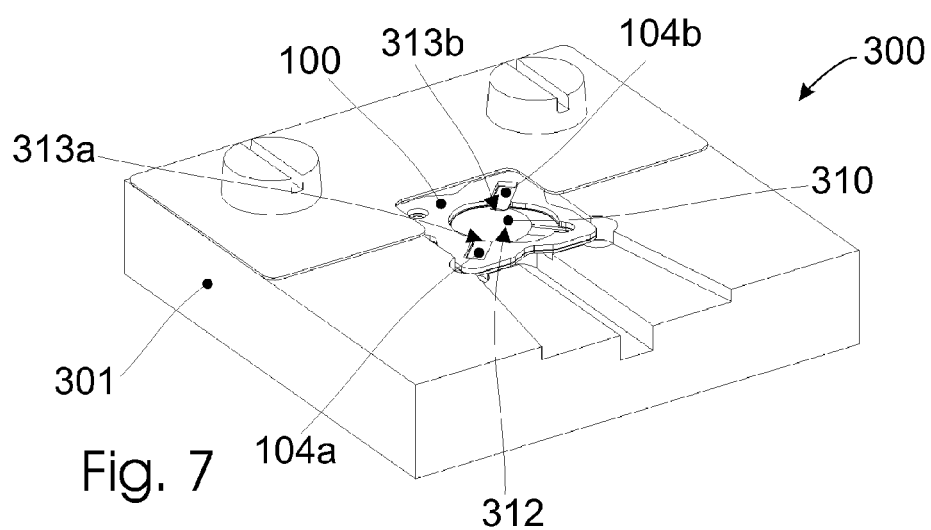
Figure 8:
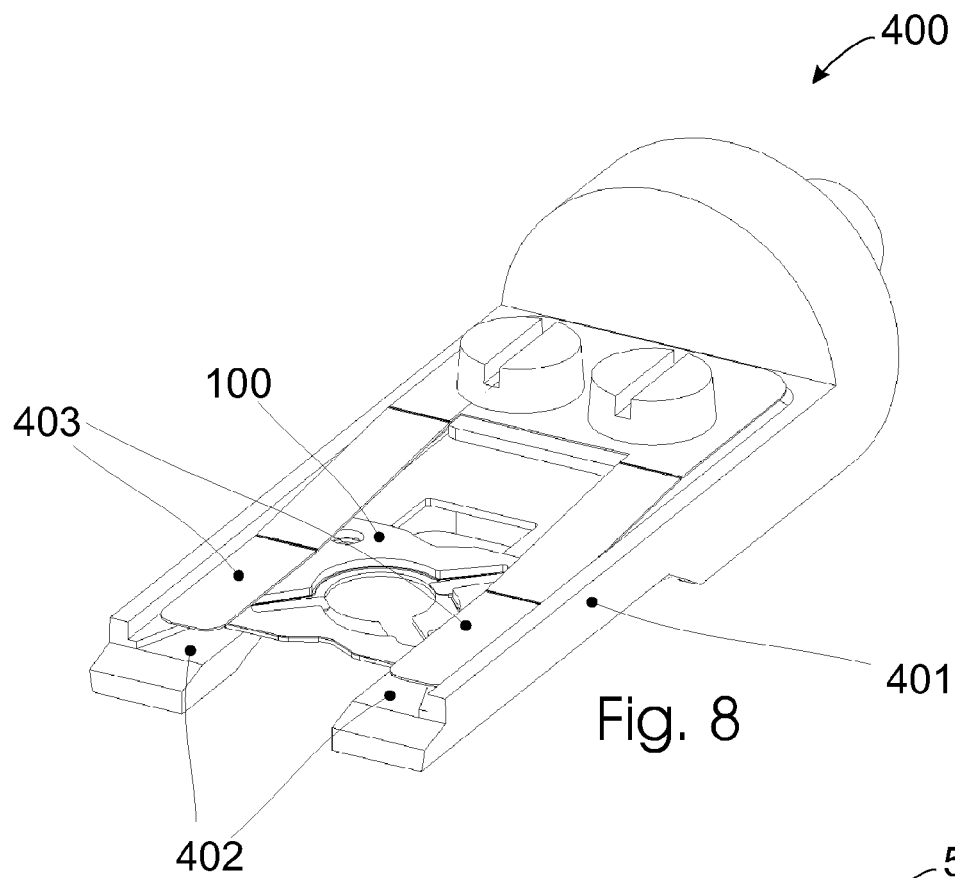
Figure 9:
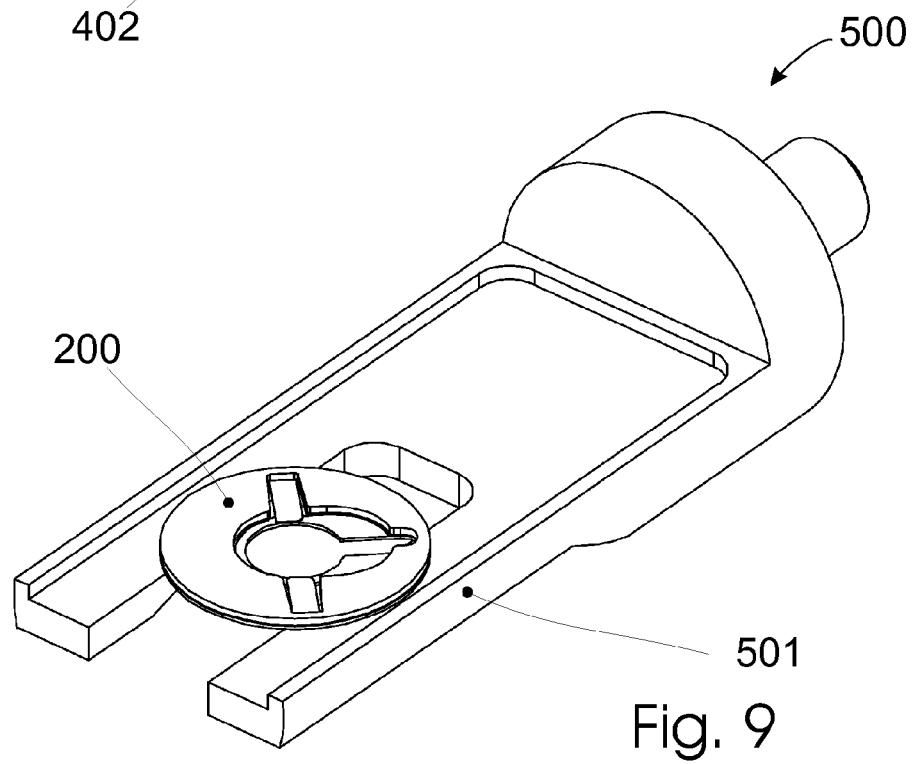

The invention, along with further advantages, will be explained below with reference to a non-limiting exemplifying embodiment that is depicted in the attached drawings, in which:

FIG. 1 is a perspective view of a first embodiment of the cartridge (mount) according to the present invention, FIG. 2 is a perspective view of the underside of the cartridge of FIG. 1, FIG. 3 is a perspective view of a second embodiment of the cartridge (mount) according to the present invention, FIG. 4 is a perspective view of a loading assistance element, with no cartridge in place, FIG. 5 shows the loading assistance element of FIG. 4 with the cartridge of FIG. 1 in place, FIG. 6 shows the loading assistance element of FIG. 5 with an electron microscopy sample carrier positioned eccentrically in the cartridge, FIG. 7 shows the loading assistance element of FIG. 6 in which the sample carrier in the cartridge is slid into its holding position, FIG. 8 is a perspective view of a region of a goniometer having a cartridge of FIG. 1 installed in it, and FIG. 9 is a perspective view of a goniometer having a cartridge of FIG. 3 installed in it.

DETAILED DESCRIPTION OF THE INVENTION

FIG. 1 shows a cartridge 100 according to the present invention for holding an electron microscopy sample carrier. Cartridge 100 comprises a base plate 101, a cover plate 102, an intermediate plate 113 arranged between base plate 101 and the cover plate, and an aperture 103 extending through base plate 101, intermediate plate 113, and cover plate 102 in a middle region thereof. Aperture 103 defines, in the beam path of the transmission electron microscope, a passage for the electron beam. Aperture 103 encompasses a round aperture region 103a in which the electron microscopy sample carrier (not depicted), which is a grid in the example shown, is arranged. Aperture 103 further encompasses an elongated aperture region 103b that enables the sample carrier to be put in place by means of forceps. Cartridge 100 furthermore comprises two clip elements 104a and 104b. Clip elements 104a, 104b are components of intermediate plate 113, intermediate plate 113 and clip elements 104a, 104b being embodied integrally. The thickness of intermediate plate 113 corresponds to the thickness of clip elements 104a, 104b. Clip elements 104a, 104b are embodied as strip-shaped spring elements that extend on the base plate toward aperture 103.

Base plate 101 further comprises a support surface 107, extending partly around aperture 103, for an electron microscopy sample carrier. Support surface 107 can of course also extend entirely (not shown) around aperture 103. Support surface 107 comprises a first support surface region 107a and a larger second support surface region 107b. The larger second support surface region 107b facilitates installation of the sample carrier in the cartridge, as described in further detail below in FIGS. 4 to 7. Base plate 101 further comprises an open base plate region 108 that corresponds to aperture 103. Cover plate 102 comprises an open cover plate region 109 that is embodied to be larger than open base plate region 108 and enables access to support surface 107 and to clip elements 104a, 104b. Intermediate plate 113 comprises, in a middle region, an open intermediate plate region that corresponds substantially to open cover plate region 109; clip elements 104a, 104b extend into the open intermediate plate region.

Each clip elements 104a, 104b possesses a first end 105a, 105b proceeding from intermediate plate 113 as well as a free second end 106a, 106b that extends toward aperture 103. The spring force of clip elements 104a, 104b is directed toward base plate 101. In the example shown, clip elements 104a, 104b are arranged opposite one another. Second ends 106a, 106b are even with the edge of support surface 107 at aperture 103.

In an alternative embodiment that is not depicted but can readily be derived from the Figures shown, the cartridge does not have an intermediate plate 113, but has only a base plate 101 and a cover plate 102. In this alternative embodiment, first ends 105a, 105b of each clip element 104a, 104b consequently do not proceed from intermediate plate 113 but instead are retained between base plate 101 and cover plate 102. With this cartridge assembled from two plates, the cover plate is embodied in correspondingly elastic fashion in order to enable welding to the base plate.

Depicted in cartridge 100 is an orifice 111, passing through base plate 101, intermediate plate 113, and cover plate 102, that serves merely as a fabrication aid and for positioning the plates with respect to one another when they are welded. A tab 112, which likewise serves as a fabrication aid, is arranged on outer edge 110 of cartridge 100. Tab 112 is removed from the cartridge after welding.

Base plate 101, intermediate plate 113 having clip elements 104a, 104b, and cover plate 102 are nondetachably connected to one another by spot welding. In order for cartridge 100 to have a surface that is as smooth and polished as possible, the individual components can be surface-treated, for example by vibratory grinding) (Trowalizing®).

Cartridge 100 is provided in particular for reception in a side-entry goniometer. It is also possible, however, to use cartridge 100 in a top-entry goniometer.

Cartridge 100 shown in FIG. 1 has an outer edge 110 with a rotationally symmetric conformation, corresponding to a four-fold rotational symmetry (90-degree symmetry) that is necessary for specific applications. If the goniometer into which cartridge 100 is inserted has only one tilt axis, cartridge 100 can be rotated, outside the transmission electron microscope, by a defined angle, i.e. 90°. Once a rotation has occurred, the tilt angle in the transmission electron microscope is consequently likewise rotated 90°, which corresponds to a rotation around two perpendicular axes.

FIG. 2 is a perspective view of the underside of cartridge 100. Base plate 101 comprises two openings 120a, 120b, extending through the base plate, that are arranged directly beneath clip elements 104a, 104b and enable access to clip elements 104a, 104b. As described later on with reference to FIGS. 4 to 7, in order for the electron microscopy sample carrier to be put in place, clip elements 104a, 104b can be raised against their spring force with the aid of peg-shaped engagement elements that are guided from below through openings 120a, 120b.

FIG. 3 shows a cartridge 200 that differs from cartridge 100 shown in FIG. 1 and FIG. 2 in that it has a round outer edge 210. The fabrication aids (orifice 111, tab 112) shown in cartridge 100 are not depicted in cartridge 200. The remaining features of cartridge 200 are analogous to those of cartridge 100. A double tilt can be implemented by means of cartridge 200. It is consequently particularly suitable for use in a "double-tilt" goniometer. One skilled in the relevant art is very familiar with double-tilt goniometers.

Cartridges 100, 200 shown in the examples are dimensioned, as mentioned above, for reception of a sample carrier in the form of a grid (grid 310, see FIG. 6 and FIG. 7), since these are the ones most often used in practice. It will be clear to one skilled in this art, however, that the cartridge according to the present invention can also be dimensioned for electron microscopy sample carriers that have a different diameter or a different external shape than the standard grid.

FIGS. 4 to 7 below show a loading apparatus for loading a cartridge according to the present invention with an electron microscopy sample carrier, and illustrate the loading method.

Loading apparatus 300 is shown in FIG. 5 and encompasses a cartridge according to the present invention, which in the example shown is the above-described cartridge 100, as well as a block-shaped loading aid 301. Referring to FIG. 4, the loading aid comprises a recess 302 that corresponds to the external shape of cartridge 100 and into which the latter can be placed, as shown in FIG. 5. Cartridge 100 can be inserted laterally, via a guide 303, into loading aid 301. Lateral insertion and removal of cartridge 100 is thereby substantially easier and more manageable than if cartridge 100 had to be put in place and removed from above. For convenient grasping of cartridge 100 with a grasping aid, e.g. a forceps, upon placement and removal of cartridge 100 into and from the loading aid, loading aid 301 comprises a depression 304 arranged in the middle of guide 303. Also arranged in recess 302 are two peg-shaped engagement elements 305a, 305b whose purpose will be illustrated below.

FIG. 5 shows loading aid 301 with cartridge 100 placed in it. Engagement elements 305a, 305b are directed toward openings 120a, 120b that are located on the underside of cartridge 100. Lowering cartridge 100 into recess 302 of loading aid 301 causes peg-shaped engagement elements 305a, 305b to slide into openings 120a, 120b and thereby raise the resilient clip elements 104a, 104b, against their spring force, upward and away from support surface 107 into a raised position.

FIG. 6 shows loading apparatus 300 with a grid 310 positioned on larger second support surface region 107b of cartridge 100. Grid 310 is located firstly in an eccentric position (labeled with the reference character 311) relative to a center of round aperture region 103a, i.e. alongside the actual holding position in which grid 310 is held in the cartridge. In the next step, grid 310 is displaced laterally toward first support surface region 107a so that, as shown in FIG. 7, it is now located in the holding position (labeled with reference character 312) on first support region 107a of cartridge 100, and beneath clip elements 104a, 104b that are in the raised position. Lifting cartridge 100 causes clip elements 104a, 104b to spring back into their original position and hold grid 310 at its edge regions 313a, 313b so that it is retained securely in cartridge 100. As is clearly evident from FIG. 7, edge regions 313a, 313b are spaced apart. The method illustrated in FIGS. 4 to 7 enables stable and stress-free installation and mounting of grid 310. In addition, very good thermal contact between grid 310 and cartridge 100 is ensured. Because grid 310 is held only at two edge regions 313a, 313b in cartridge 100, a large tilt angle is possible. Once grid 310 is retained in cartridge 100, cartridge 100 can be removed from loading aid 301 and installed in a goniometer.

The method shown in FIGS. 3 to 7 can be carried out analogously with cartridge 200 of FIG. 3, and with any cartridge according to the present invention. In that case the recess in the loading aid must of course be configured in accordance with the dimensions of the respective cartridge.

FIG. 8 shows part of a goniometer 400 having a cartridge 100 (shown in the illustration with an electron microscopy sample carrier) received therein. Receiving region 401 of goniometer 400 provided for the reception of cartridge 100 is fork-shaped. Cartridge 100 is placed onto elongated support surfaces 402 of receiving region 401 and retained on the goniometer by means of two resilient clips 403.

Analogously to FIG. 8, FIG. 9 shows a goniometer 500 having a cartridge 200 with a round outer rim received therein, the resilient clips for holding cartridge 200 in the fork-shaped receiving region 501 of goniometer 500 not being depicted.

Further mechanisms for holding a cartridge (mount) for a sample carrier in a goniometer are known from the existing art. One skilled in the art will therefore be capable of configuring the cartridge according to the present invention in such a way that those mechanisms are usable for a cartridge according to the present invention as well. The mechanism shown in EP 1 947 675 A1, for example, is also suitable for a cartridge according to the present invention. The goniometer described in EP 1 947 675 1 comprises a fork-shaped receiving region that encompasses two rods oriented in parallel. The rods engage into a groove extending around the outer edge of the cartridge, and in that manner retain the cartridge in the goniometer. This holding mechanism could also be capable of implementation for the cartridge according to the present invention. For this, cartridges 100, 200 shown in the examples would be equipped with a groove (not depicted) extending around the outer edge of the cartridge. A further example that may be mentioned again at this juncture is the double-tilt goniometer, in which the cartridge is mounted pivotably around two axes lying in the sample carrier plane (see WO 00/10191). Other known goniometers permit tilting of the cartridge around only one axis.

The above-described implementations of the invention are merely examples among many, and are consequently not to be regarded as limiting.

What is claimed is:

1. A mount (100, 200) for holding an electron microscopy sample carrier (310), the mount comprising:
    a base plate (101) having an opening (103) passing through a middle region of the base plate (101);
    a support surface (107) for supporting the sample carrier, the support surface extending at least partly around the opening; and
    a holding apparatus (104a, 104b) provided on the base plate, the holding apparatus being operable to frictionally engage the sample carrier to hold the sample carrier on the support surface;
    wherein the holding apparatus includes at least two mutually independent clip elements (104a, 104b) extending from the base plate toward the opening, wherein the clip elements are arranged to engage respective edge regions of the sample carrier that are spaced apart from one another.

2. The mount according to claim 1, wherein the holding apparatus includes exactly two clip elements.

3. The mount according to claim 2, wherein the two clip elements are arranged opposite one another.

4. The mount according to claim 1, wherein each of the clip elements is strip-shaped and is arranged substantially parallel to the base plate.

5. The mount according to claim 1, wherein each of the clip elements is a spring element.

6. The mount according to claim 1, wherein each of the clip elements has a first end (105a, 105b) retained on the base plate and a second end (106a, 106b) oriented toward the opening for frictionally engaged holding of the sample carrier on the support surface.

7. The mount according to claim 6, wherein the second end of each clip element is even with the edge of the support surface at the opening.

8. The mount according to claim 6, further comprising a cover plate (102) arranged on the base plate (101), the cover plate (102) including an open region (109) enabling access to the sample carrier and to the clip elements.

9. The mount according to claim 8, wherein the first end (105a, 105b) of each clip element (104a, 104b) is retained between the base plate (101) and the cover plate (102).

10. The mount according to claim 8, further comprising an intermediate plate arranged between the base plate (101) and the cover plate (102), the clip elements (104a, 104b) being components of the intermediate plate.

11. The mount according to claim 8, wherein the open region (109) in the cover plate (102) has a size that permits the sample carrier (310) to be put in place eccentrically, such that the sample carrier (310) can be placed into the mount (100, 200) alongside that position (312) in which the sample carrier (310) can be held in the mount (100, 200), and then laterally displaced into the position (312) in which the sample carrier can be held in the mount (100, 200).

12. The mount according to claim 1, wherein the base plate includes a respective opening (120a, 120b) extending through the base plate beneath each of the clip elements (104a, 104b).

13. The mount according to claim 1, wherein the mount (100) comprises an outer edge (110) having a rotationally symmetrical conformation, corresponding to a four-fold rotational symmetry.

14. The mount according to claim 1, wherein the mount (200) comprises a substantially round outer edge (210).

15. The mount according to claim 1, wherein the mount is receivable in a specimen holder apparatus (400, 500) for an electron microscope.

16. A specimen holder apparatus (400, 500) for an electron microscope, comprising a detachably receivable mount (100, 200) according to claim 1.

17. The specimen holder apparatus according to claim 16, wherein the specimen holder apparatus is in the form of a goniometer.

18. The specimen holder apparatus according to claim 17, wherein the specimen holder apparatus is in the form of a side-entry goniometer.

19. The specimen holder apparatus according to claim 16, wherein the mount is mounted tiltably around at least one axis lying in a plane of the sample carrier.

20. The specimen holder apparatus according to claim 19, wherein the mount is mounted tiltably around two axes lying in the plane of the sample carrier.

21. A loading apparatus (300) comprising:
a mount (100, 200) for holding an electron microscopy sample carrier (310), the mount comprising a base plate (101) having an opening (103) passing through a middle region of the base plate (101), a support surface (107) extending at least partly around the opening for supporting the sample carrier, and a holding apparatus (104a, 104b) provided on the base plate, the holding apparatus being operable to frictionally engage the sample carrier to hold the sample carrier on the support surface, wherein the holding apparatus includes at least two mutually independent clip elements (104a, 104b) extending from the base plate toward the opening, wherein the clip elements are arranged to engage respective edge regions of the sample carrier that are spaced apart from one another, and wherein the base plate includes a respective opening (120a, 120b) extending through the base plate beneath each of the clip elements (104a, 104b); and
a loading assistance element (301) into which the mount (100, 200) is placeable, the loading assistance element (301) comprising engagement elements (305a, 305b) extending through the openings (120a, 120b) arranged beneath the clip elements (104a, 104b) in the base plate (101) of the mount (100, 200), wherein the engagement elements move the clip elements (104a, 104b) of the mount (100, 200) against their holding force in a direction away from the base plate (101).

22. A method for loading a mount (100, 200) with an electron microscopy sample carrier (310) by means of a loading apparatus (300) according to claim 21, comprising the steps of:
a) placing the mount (100, 200) into the loading assistance element (301),
b) moving the clip elements (104a, 104b), by means of the engagement elements (305a, 305b) of the loading assistance element (301), in a direction away from the base plate (101) into a raised position,
c) placing the sample carrier (310) onto the support surface (107) of the mount (100, 200), and
d) removing the mount (100, 200) from the loading assistance element (310) and holding the sample carrier (310) in frictionally engaged fashion on the support surface (107) by moving the clip elements (104a, 104b) back into their original position.

\* \* \* \* \*